United States Patent
Iwasaki et al.

(10) Patent No.: US 10,861,769 B2
(45) Date of Patent: Dec. 8, 2020

(54) INSULATED HEAT DISSIPATION SUBSTRATE

(71) Applicant: NGK INSULATORS, LTD., Nagoya (JP)

(72) Inventors: Shingo Iwasaki, Nagoya (JP); Takashi Ebigase, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 16/540,321

(22) Filed: Aug. 14, 2019

(65) Prior Publication Data

US 2019/0371701 A1    Dec. 5, 2019

Related U.S. Application Data

(63) Continuation of application No. PCT/JP2017/006947, filed on Feb. 23, 2017.

(51) Int. Cl.
*H01L 23/00* (2006.01)
*H01L 23/373* (2006.01)
*F28F 21/04* (2006.01)

(52) U.S. Cl.
CPC .......... *H01L 23/3735* (2013.01); *F28F 21/04* (2013.01)

(58) Field of Classification Search
None
See application file for complete search history.

(56) References Cited

U.S. PATENT DOCUMENTS

2016/0044780 A1    2/2016    Inagaki et al.

FOREIGN PATENT DOCUMENTS

| JP | 2002-232090 A1 | 8/2002 |
| JP | 2009-158611 A1 | 7/2009 |
| JP | 2016-039253 A1 | 3/2016 |
| JP | 2016-141210 A1 | 8/2016 |

OTHER PUBLICATIONS

International Search Report and Written Opinion (Application No. PCT/JP2017/006947) dated May 9, 2017.
English translation of International Preliminary Report on Patentability (Application No. PCT/JP2017/006947) dated Sep. 6, 2019.

*Primary Examiner* — Reema Patel
(74) *Attorney, Agent, or Firm* — Burr & Brown, PLLC

(57) ABSTRACT

An insulated heat dissipation substrate including: a ceramic substrate; and a conductor layer bonded onto at least one of main surfaces of the ceramic substrate, wherein the conductor layer includes an upper surface, a lower surface bonded to the ceramic substrate, and a side surface connecting the upper surface with the lower surface wherein, a tip of the upper surface recedes in the normal direction of the conductor layer from a tip of the lower surface, the side surface has a contour having an inwardly recessed curve line and having a portion receding in the normal direction of the conductor layer from the tip of the upper surface, and a connection portion between the upper surface and the side surface has a rounded shape such that a maximum radius R of a circle is 0.1 µm≤R≤5 µm on average.

5 Claims, 4 Drawing Sheets

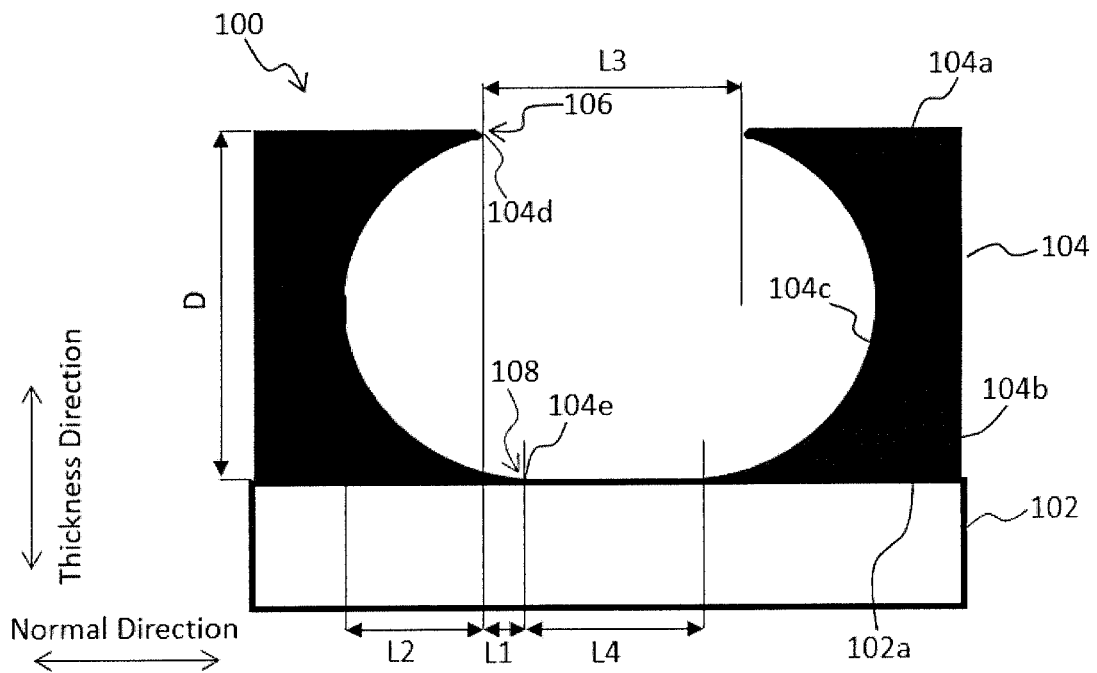
[FIG. 1]

[FIG. 2]
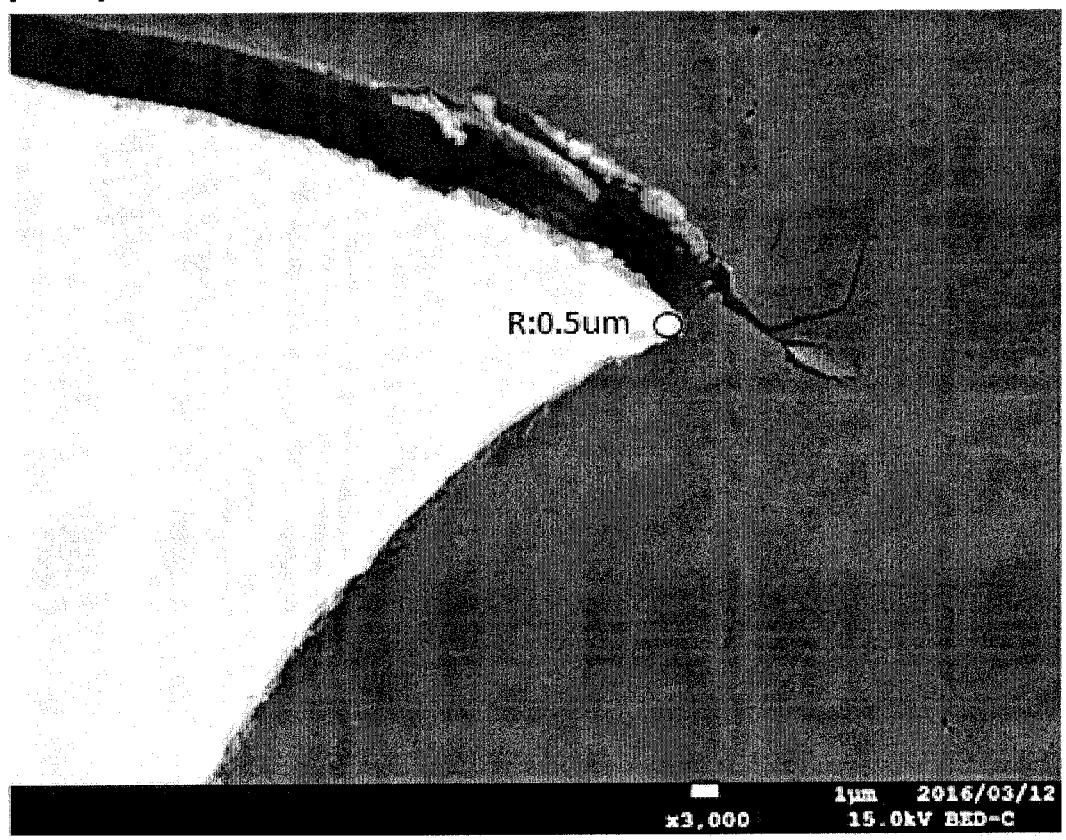

[FIG. 3]
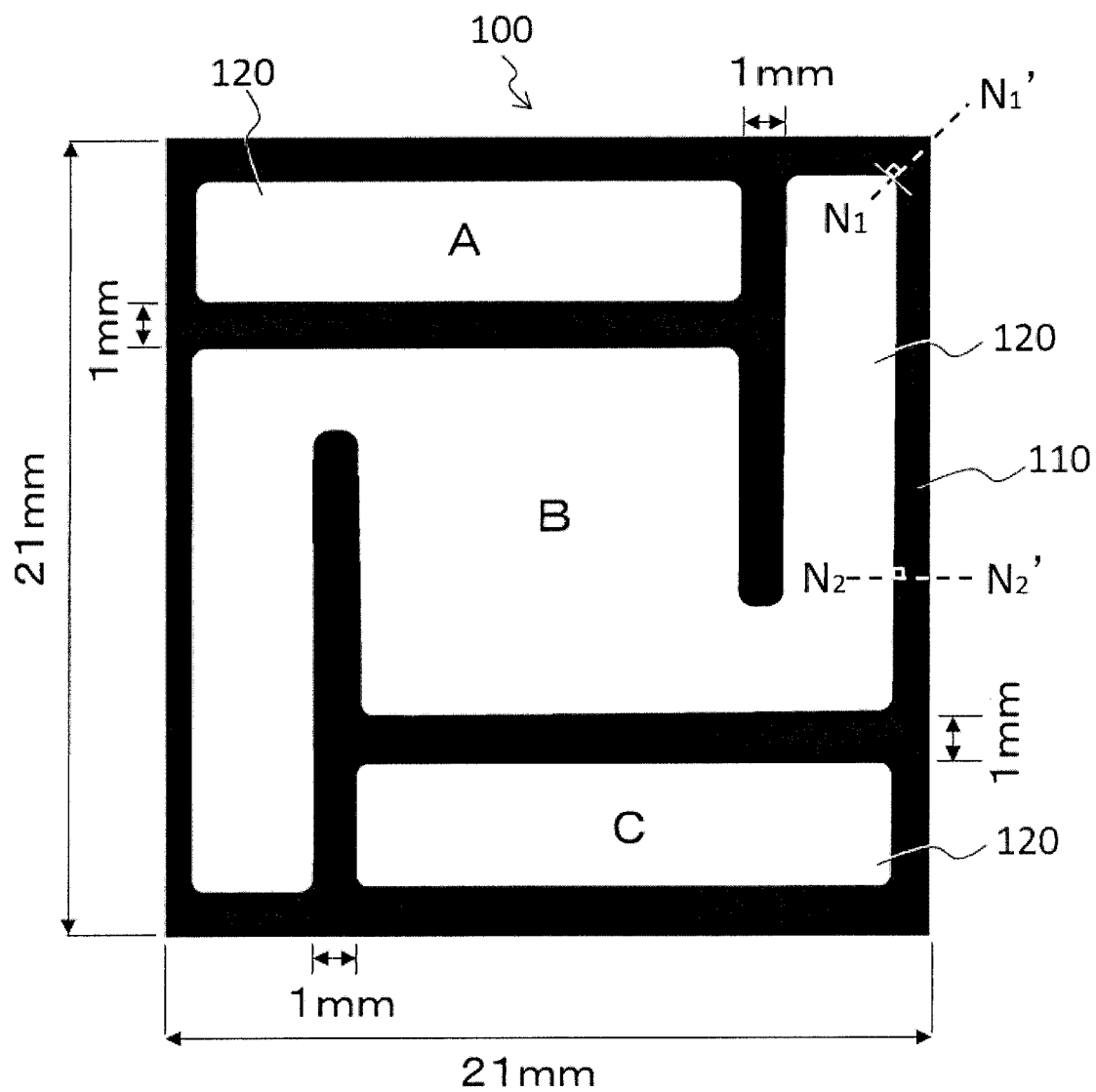

[FIG. 4]
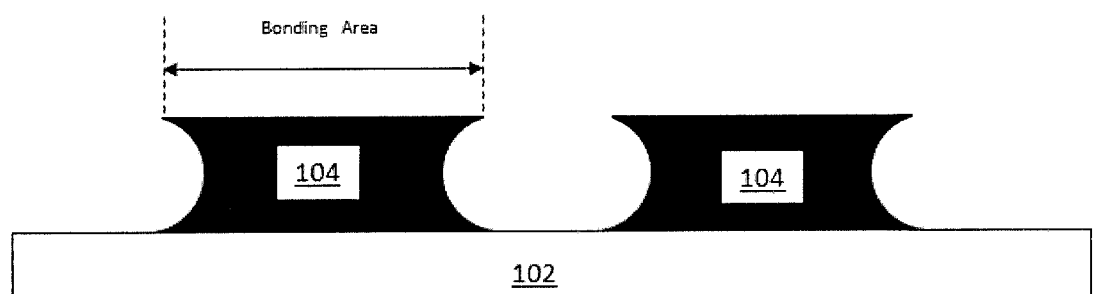
(a)
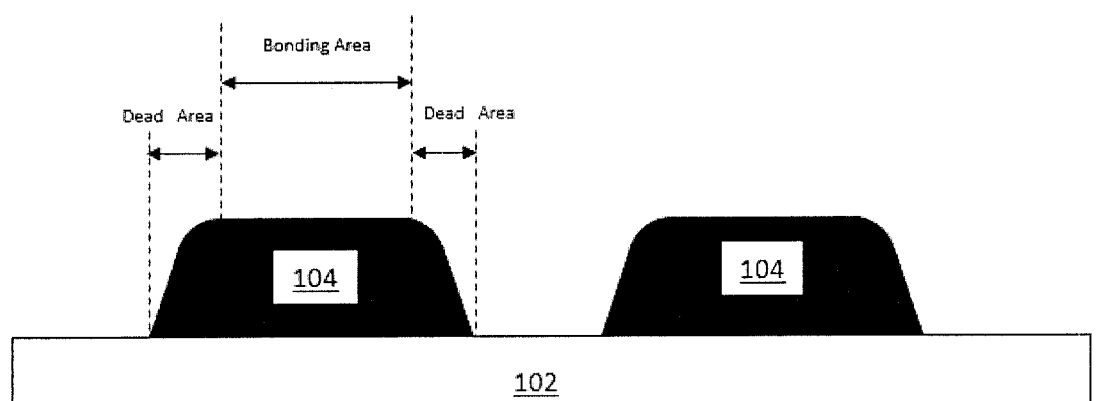
(b)

INSULATED HEAT DISSIPATION SUBSTRATE

FIELD OF THE INVENTION

The present disclosure relates to an insulated heat dissipation substrate. More particularly, the present disclosure relates to an insulated heat dissipation substrate on which a power semiconductor is mounted.

BACKGROUND OF THE INVENTION

Power semiconductor modules are used for power control of HEVs/EVs and trains. The power semiconductor modules are formed of a power semiconductor such as, for example, a switching element, an IGBT and a MOSFET; an insulated heat dissipation substrate provided with a conductor layer (for example, an island-shaped metal plate) for circuit formation; a cooling member; and a housing. The power semiconductor module is subjected to high voltage to perform high power control. Therefore, the insulated heat dissipation substrate with the power semiconductor mounted requires electrical insulating properties between adjacent conductor layers.

A DCB (Direct Copper Bond) substrate is widely known as an insulated heat dissipation substrate. The DCB substrate is obtained by directly bonding a thin copper plate to a ceramic substrate such as an alumina substrate, an aluminum nitride substrate and a silicon nitride substrate. Also, an AMB (Active Metal Bonding) substrate is widely known as an insulated heat dissipating substrate. The AMB substrate is formed by bonding a ceramic substrate such as an alumina substrate, an aluminum nitride substrate or a silicon nitride substrate to a thin copper plate via a bonding layer formed using a brazing material (a bonding material) containing an active metal. For such insulated heat dissipation substrates, research and development has been continued to achieve further improvement of performance.

With regard to the electrical insulating properties between the conductor layers, Japanese Patent Application Publication No. 2002-232090 A (Patent Document 1) discloses an invention relating to a ceramic circuit substrate formed by attaching a plurality of metal circuit boards to an upper surface of a ceramic substrate, wherein a voltage applied to each metal circuit board is 400 V or more, a distance between the adjacent metal circuit boards is 1.5 mm or less, and a curvature radius of an upper surface outer peripheral corner portion of each metal circuit board is 0.05 mm or more. Patent document 1 discloses that according to the invention, an electrical charge is not concentrated on the upper surface outer peripheral corner portion of each metal circuit board, and even if a current with a high voltage of 400 V or more is applied to each metal circuit board and the distance between the adjacent metal circuit boards is reduced to 1.5 mm or less, any generation of electric discharge between the metal circuit boards is effectively prevented, and as a result, the electrical insulating properties between the adjacent metal circuit boards can be ensured and the ceramic circuit substrates can be stably operated with high reliability.

CITATION LIST

Patent Literature

Patent Document 1: Japanese Patent Application Publication No. 2002-232090 A

SUMMARY OF THE INVENTION

Technical Problem

Recently, improvement of power density and miniaturization has been required for power semiconductor modules. According to the invention described in Patent Document 1, it discloses that the electric discharge between the metal circuit boards is suppressed. However, for further miniaturization of the power semiconductor modules, the electric discharge between the metal circuit boards should be suppressed while at the same time increasing a semiconductor chip mounting area per unit area of the insulated heat dissipation substrate. In this regard, according to the invention described in Patent Document 1, the upper surface outer peripheral corner portion of the metal circuit board is chamfered by an arc shape having a curvature radius of 0.05 mm (50 µm) or more, so that a tip of the upper surface of the metal circuit board generates a large dead area, and an area for bonding the semiconductor chip is reduced. Therefore, the invention described in Patent Document 1 still has room for improvement in terms of achieving both of the miniaturization of the power semiconductor modules and the suppression of the electric discharge between the metal circuit boards.

The present disclosure has been made in view of the above circumstances. An object of the present disclosure is to provide an insulated heat dissipation substrate capable of enlarging a bonding area of a semiconductor chip while ensuring electrical insulating properties between adjacent conductor layers.

Solution to Problem

As a result of intensive studies to solve the above problems, the present inventors have found that even if the bonding area is enlarged so as to allow the tip of the upper surface of the conductor layer to protrude toward the adjacent conductor layer, the electrical insulating properties between the adjacent conductor layers can be improved when a cross-sectional shape near the tip of the upper surface of the conductor layer is rounded. Furthermore, in this case, the present inventors have found that sufficient electrical insulating properties can be obtained between the conductor layers even if the roundness near the tip of the upper surface of the conductor layer is significantly smaller than the curvature radius required for Patent Document 1. The present disclosure has been completed based on the above findings.

In one aspect, the present disclosure relates to:

an insulated heat dissipation substrate comprising: a ceramic substrate; and a conductor layer bonded onto at least one of main surfaces of the ceramic substrate, wherein the conductor layer comprises: an upper surface; a lower surface bonded to the ceramic substrate; and a side surface connecting the upper surface with the lower surface;

wherein, when the conductor layer and the ceramic substrate are observed in a cross section parallel to both of a normal direction relative to a tangential line of a contour of the conductor layer as viewed in plane and a thickness direction, a tip of the upper surface recedes in the normal direction of the conductor layer from a tip of the lower surface;

the side surface has a contour having an inwardly recessed curve line and having a portion receding in the normal direction of the conductor layer from the tip of the upper surface; and a connection portion between the upper surface and the side surface has a rounded shape such that a maximum radius R of a circle is 0.1 µm≤R≤5 µm on average, the circle being inscribed in the tip of the upper surface and formable inside the upper surface and the side surface.

In one embodiment of the insulated heat dissipation substrate according to the present disclosure, when the conductor layer and the ceramic substrate are observed in the cross section parallel to both of the normal direction of the conductor layer and the thickness direction, an average distance L1 in the normal direction of the conductor layer from the tip of the lower surface to the tip of the upper surface and an average thickness D of the conductor layer satisfy a relationship: 1≤D/L1≤50.

In another embodiment of the insulated heat dissipation substrate according to the present disclosure, when the conductor layer and the ceramic substrate are observed in the cross section parallel to both of the normal direction of the conductor layer and the thickness direction, an average distance L2 of the conductor layer in the normal direction from the tip of the upper surface to a most receding portion of the side surface in the normal direction of the conductor layer and an average thickness D of the conductor layer satisfy a relationship: 1≤D/L2≤20.

In still another embodiment of the insulated heat dissipation substrate according to the present disclosure, when the conductor layer and the ceramic substrate are observed in the cross section parallel to both of the normal direction of the conductor layer and the thickness direction, the average distance L1 in the normal direction of the conductor layer from the tip of the lower surface to the tip of the upper surface, an average distance L2 of the conductor layer in the normal direction from the tip of the upper surface to the most receding portion of the side surface in the normal direction of the conductor layer and an average thickness D of the conductor layer satisfy relationship: 1≤D/(L1+L2)≤15.

In still another embodiment of the insulated heat dissipation substrate according to the present disclosure, when the conductor layer and the ceramic substrate are observed in the cross section parallel to both of the normal direction of the conductor layer and the thickness direction, the upper surface has a portion inclined in a downward direction as it approaches the tip of the upper surface, and a length of the portion in the normal direction is 300 µm or less on average.

Advantageous Effects

According to the present disclosure, it is possible to provide an insulated heat dissipation substrate in which a bonding area of a semiconductor chip is larger than that of the prior arts while ensuring electrical insulating properties between adjacent conductor layers. Therefore, the present disclosure can contribute to production of small-sized power semiconductor modules having improved practicability.

BRIEF DESCRIPTION OF THE DRAWINGS

FIG. 1 is a schematic view of an insulated heat dissipation substrate according to an embodiment of the present disclosure when partially observing a conductor layer and a ceramic substrate in a cross section parallel to both of a normal direction relative to a tangential line of a contour of the conductor layer as viewed in plane and a thickness direction.

FIG. 2 is a SEM image near a tip of an upper surface of a conductor layer of an insulated heat dissipation substrate according to one embodiment of the present disclosure when partially observing a conductor layer and a ceramic substrate in a cross section parallel to both of a normal direction relative to a tangential line of a contour of the conductor layer as viewed in plane and a thickness direction.

FIG. 3 is a schematic plan view of an insulated heat dissipation substrate produced in Example.

FIG. 4 is a schematic view showing a cross section (a) of an insulated heat dissipation substrate according to an embodiment of the present disclosure as compared with a cross section (b) of a conventional insulated heat dissipation substrate.

DESCRIPTION OF THE PREFERRED EMBODIMENTS

Hereinafter, embodiments of the present disclosure will be specifically described with reference to the drawings. However, it should be understood that the present disclosure is not limited the following embodiments, and various modifications and improvements of the following embodiments may be made based on the knowledge of a person skilled in the art, without departing from the spirit of the present disclosure.

<1. Insulated Heat Dissipation Substrate>

FIG. 1 shows a schematic view of an insulated heat dissipation substrate 100 according to an embodiment of the present disclosure, when partially observing conductor layers adjacent to each other and a ceramic substrate in a cross section parallel to both of a normal direction relative to a tangential line of a contour of the conductor layer as viewed in plane and a thickness direction. As used herein, the "viewed in plane" refers to a method of observing the insulated heat dissipation substrate from a direction where its projected area is maximized, and the "thickness direction" refers to a direction parallel to this observing direction. Examples of the normal line relative to the tangential line of the contour of the conductor layer 120 as viewed in plane are shown by the dotted line $N_1$-$N_1'$ and the dotted line $N_2$-$N_2'$ in FIG. 3. The insulated heat dissipation substrate 100 includes: a ceramic substrate 102; and a conductor layer 104 bonded onto at least one of main surfaces of the ceramic substrate 102. The conductor layer 104 may be bonded onto one main surface of ceramic substrate 102 or may be bonded onto both main surfaces.

The conductor layer 104 has: an upper surface 104a; a lower surface 104b bonded to the ceramic substrate 102; and a side surface 104c connecting the upper surface 104a with the lower surface 104b. The ceramic substrate 102 has a bonding surface 102a bonded to the lower surface 104b of the conductor layer. As used herein, a direction away from the ceramic substrate 102 in the thickness direction is defined to as an "upward direction", and a direction away from the conductor layer 104 from the thickness direction is defined as a "downward direction", based on a bonding interface between the ceramic substrate 102 and the conductor layer 104 (the lower surface 104b and the bonding surface 102a).

The insulated heat dissipation substrate 100 can be used as a substrate on which a power semiconductor (not shown) is mounted, in a power semiconductor module including the power semiconductor such as, for example, a switching element, an IGBT, and a MOSFET. An example of plan views of the insulated heat dissipation substrate 100 is shown in FIG. 3. The conductor layer 104 can be formed in any pattern for forming an electric circuit, and the power semiconductor can be mounted on the conductor layer 104 (e.g., an island-shaped metal plate). In FIG. 3, three island-shaped metal plates A, B, and C each having the predetermined shape are formed on the insulated heat dissipation substrate 100.

Examples of the ceramic substrate 102 include nitride ceramic substrates such as a silicon nitride ($Si_3N_4$) substrate and an aluminum nitride (AlN) substrate, as well as an alumina ($Al_2O_3$) substrate. In order to realize the present disclosure, the planar shape and size of the ceramic substrate 102 are not particularly limited. However, from the viewpoint of downsizing of the power semiconductor module, examples thereof include a ceramic substrate having a rectangular shape as viewed in plane, which has one side of from about 20 mm to 70 mm and a thickness of from 0.1 mm to 1.0 mm.

The conductor layer 104 can be formed of a metal such as copper (Cu), a copper alloy, aluminum (Al), or an aluminum alloy. The conductor layer 104 can also be formed of a high melting point metal such as tungsten (W) and molybdenum (Mo) or of a metallized layer of silver (Ag). In addition, nickel, iron, titanium and molybdenum can also be used. An average thickness D of the conductor layer 104 (an average of differences in height between the upper surface 104a and the lower surface 104b of the conductor layer 104) is preferably from 0.3 mm to 2.0 mm, and more preferably from 0.5 mm to 1.5 mm, in terms of miniaturizing the power semiconductor module.

Referring to FIG. 1, in the insulated heat dissipation substrate 100 according to an embodiment of the present disclosure, a tip 104d of the upper surface of the conductor layer recedes in the normal direction of the conductor layer 104 from a tip 104e of the lower surface of the conductor layer. Further, in the insulated heat dissipation substrate 100, the side surface 104c of the conductor layer has a contour having an inwardly recessed curve line and having a portion receding in the normal direction of the conductor layer 104 from the tip 104d of the upper surface of the conductor layer. By having such a structure, a distance between the adjacent conductor layers is prevented from being too close, so that electrical insulating properties between the adjacent conductor layers can be improved, while the tip 104d of the upper surface of the conductor layer protrudes toward the adjacent conductor layer, so that a bonded area can be enlarged.

As used herein, the tip 104d of the upper surface of the conductor layer refers to the most protruding point of the conductor layer 104 in the normal direction at a connection portion 106 between the upper surface 104a of the conductor layer and the side surface 104c of the conductor layer when performing the above cross-sectional observation. The tip 104e of the lower surface of the conductor layer refers to the most protruding point of the conductor layer in the normal direction at the connection portion 108 between the lower surface 104b of the conductor layer and the side surface 104c of the conductor layer when performing the above cross-sectional observation.

FIG. 4 shows a cross section (a) of the insulated heat dissipation substrate according to the embodiment of the present disclosure as compared with a cross section (b) of the conventional insulated heat dissipation substrate. As can be seen from the comparison with each other, the conventional insulated heat dissipation substrate has a trapezoidal cross section, so that a dead area is larger and a bonding area on which the semiconductor chip can be mounted is smaller, whereas the insulated heat dissipation substrate according the present disclosure has little dead area, so that the bonding area on which the semiconductor chip can be mounted can be enlarged. Therefore, according to the present disclosure, if amounts of the semiconductor chips mounted are the same, the area of the insulated heat dissipation substrate can be decreased, in other words, the semiconductor module can be miniaturized.

In the insulated heat dissipation substrate 100 having such a cross-sectional structure, the shape of the connection portion 106 between the upper surface 104a of the conductor layer and the side surface 104c of the conductor layer significantly affects the electrical insulating properties between the adjacent conductor layers. Even if an average distance L3 between the tips 104d of the upper surfaces of the adjacent conductor layers is the same, the electrical insulating properties are significantly improved only by forming the connection portion 106 into a slightly rounded shape. In the insulated heat dissipation substrate 100 according to the embodiment of the present disclosure, when the conductor layer 104 and the ceramic substrate 102 are observed in the cross section parallel to both of the normal direction relative to the tangential line of the contour of the conductor layer 104 as viewed in plane and the thickness direction, the connection portion 106 between the upper surface 104a of the conductor layer and the side surface 104c of the conductor layer has a rounded shape such that the maximum radius R of a circle that can be inscribed in the tip 104d of the upper surface of the conductor layer and can be formed inside the upper surface 104a of the conductor layer and the side surface 104c of the conductor layer is 0.1 µm≤R≤5 µm on average.

From the viewpoint of improving the electrical insulating properties between the adjacent conductor layers, the average of the maximum radius R is preferably 0.1 µm or more, and more preferably 0.4 µm or more, and even more preferably 0.6 µm or more, and still more preferably 1.0 µm or more, and even more preferably 2.0 µm or more. A larger maximum radius R contributes to improvement of the electrical insulation, but even if it is excessively large, the electric discharge suppression effect tends to be saturated, and the shape processing of the connection portion 106 requires extra labor and time. Therefore, from the viewpoint of productivity, the average of the maximum radius R is 5 µm or less.

In the present specification, the tip 104d of the upper surface of the conductor layer is a boundary point, and a portion higher than the tip 104d is defined to be the upper surface 104a of the conductor layer, and a portion lower than the tip 104d is defined to be the side surface 104c of the conductor layer. In some embodiments of the present disclosure, the upper surface 104a of the conductor layer may have a shape that is downwardly inclined toward the tip 104d. According to the above definition, such an inclined portion is also regarded as a part of the upper surface 104a of the conductor layer. A longer inclined portion provides a smaller bonding area, so it is desirable that the inclined portion is shorter. Specifically, when the conductor layer and the ceramic substrate are observed in the cross section parallel to both of the normal direction of the conductor layer and the thickness direction, the upper surface has a portion that is inclined in the downward direction as it approaches the tip of the upper surface, and the length of that portion in the normal direction is preferably 300 µm or less, and more preferably 250 µm or less, and still more preferably 200 µm or less on average, and for example, it can be in a range of from 50 to 300 µm, typically in a range of from 100 to 250 µm. In the present disclosure, the length of the inclined portion in the normal direction can be determined by measuring a distance from a start point to an end portion. The start point is a point where an inclination angle the upper surface of the conductor layer in the downward direction reaches 1° for the first time provided that the normal direction of the conductor layer is the inclination angle of 0°, and the end point is the tip of the upper surface of the conductor layer.

FIG. 2 is a SEM photograph of a cross section near the connection portion 106 of the conductor layer according to the embodiment of the insulated heat dissipation substrate according to the present disclosure. In FIG. 2, the connecting portion 106 has a rounded shape capable of forming an inscribed circle having a maximum radius R of 0.5 µm. Moreover, it can be confirmed that the upper surface of the conductor layer has a shape inclined in the downward direction toward the tip.

In addition, an average value of the maximum radius R is determined by arbitrary five or more cross-sectional observations of the insulated heat dissipation substrate to be measured (the same is true for an average value of the following parameters).

In the insulated heat dissipation substrate 100 according to the embodiment of the present disclosure, when the conductor layer 104 and the ceramic substrate 102 are observed in the cross section parallel to both of the normal direction to the tangential line of the contour of the conductor layer 104 as viewed in plane and the thickness direction, an average distance L1 in the normal direction of the conductor layer 104 from the tip 104e of the lower surface of the conductor layer to the tip 104d of the upper surface of the conductor layer can be recognized. From the viewpoint of ensuring both of the electrical insulating properties between the adjacent conductor layers and the bonding area of the semiconductor chip, the average distance L1 and an average thickness D of the conductor layer preferably satisfy the relationship: $1 \leq D/L1 \leq 50$. From the viewpoint of improving the electrical insulating properties between adjacent conductor layers when comparing them provided that an average distance L4 between the tips 104e of the lower surface of the adjacent conductor layers is constant, they preferably satisfy the relationship: $D/L1 \leq 30$, and more preferably $D/L1 \leq 20$, and still more preferably $D/L1 \leq 10$, and even more preferably $D/L1 \leq 5$. From the viewpoint of enlarging the bonding area when comparing them provided that the average distance L4 between the tips 104e of the lower surface of the adjacent conductor layers is constant, they preferably satisfy $2 \leq D/L1$, and more preferably $4 \leq D/L1$.

For example, the average distance L1 can be 5 µm or more, or 10 µm or more, or 50 µm or more, or 100 µm or more. Further, the average distance L1 can be 300 µm or less, or 250 µm or less, or 200 µm or less, or 150 µm or less.

In the insulated heat dissipation substrate 100 according to the embodiment of the present disclosure, when the conductor layer 104 and the ceramic substrate 102 are observed in the cross section parallel to both of the normal direction relative to the tangential line of the contour of the conductor layer 104 as viewed in plane and the thickness direction, it is recognized that an average distance L2 in the normal direction of the conductor layer 104 from the tip 104d of the upper surface of the conductor layer to the most receding portion of the side surface 104c of the conductor layer 104 in the normal direction. Since the power semiconductor modules are used under a cooling/heating cycle environment, the insulated heat dissipation substrate on which the power semiconductor is mounted is required to have durability to the cooling/heating cycle, as well as the electrical insulating properties between adjacent conductor layers. The controlling of the relationship between the average distance L2 and the average thickness D of the conductor layer, and furthermore the relationship among the average distance L1, the average distance L2 and the average thickness D of the conductor layer can improve the durability to the cooling/heating cycle.

Specifically, from the viewpoint of improving the cooling/heating cycle durability, the average distance L2 and the average thickness D of the conductor layer preferably satisfy $D/L2 \leq 20$, and more preferably $D/L2 \leq 15$, and even more preferably $D/L2 \leq 10$, and still more preferably $D/L2 \leq 6$. However, from the viewpoint of increasing the mechanical strength of the conductor layer, they preferably satisfy $1 \leq D/L2$, and more preferably $2 \leq D/L2$, and still more preferably $4 \leq D/L2$.

From the viewpoint of improving the cooling/heating cycle durability, the average distance L1, the average distance L2 and the average thickness D of the conductor layer preferably satisfy the relationship: $D/(L1+L2) \leq 15$, and more preferably $D/(L1+L2) \leq 10$, and still more preferably $D/(L1+L2) \leq 5$, and even more preferably $D/(L1+L2) \leq 3$, and even more preferably $D/(L1+L2) \leq 2$. However, from the viewpoint of ensuring the mechanical strength of the conductor layer and bonding area, $1 \leq D/(L1+L2)$ is preferable, and $2 \leq D/(L1+L2)$ is more preferable.

For example, the average distance L2 can be 20 µm or more, or 40 µm or more, or 60 µm or more. The average distance L2 can be 150 µm or less, or 100 µm or less, or 90 µm or less.

When the conductor layer 104 and the ceramic substrate 102 are observed in the cross section parallel to both of the normal direction relative to the tangential line of the contour of the conductor layer 104 as viewed in plane and the thickness direction, a longer average distance L3 between the tips 104d of the upper surface of the adjacent conductor layers in the normal direction can increase the electrical insulating properties between adjacent conductor layers, while a shorter average distance L3 contributes to the miniaturization of the semiconductor module. Therefore, from the viewpoint of improving the electrical insulating properties, the average distance L3 is preferably 1.0 mm or more, and more preferably 1.5 mm or more, and still more preferably 2.0 mm or more. Further, from the viewpoint of contributing to the miniaturization, the average distance L3 is preferably 3.0 mm or less, and more preferably 2.5 mm or less, and still more preferably 2.0 mm or less.

When the conductor layer 104 and the ceramic substrate 102 are observed in the cross section parallel to both of the normal direction relative to the tangential line of the contour of the conductor layer 104 as viewed in plane and the thickness direction, a longer average distance L4 between the tips 104e of the lower surface of the adjacent conductor layers in the normal direction can increase the electrical insulating properties between the adjacent conductor layers, while a shorter average distance L4 contributes to the miniaturization of the semiconductor module. Specifically, from the viewpoint of improving the electrical insulating properties, the average distance L4 is preferably 1.0 mm or more, and more preferably 1.5 mm or more, and even more preferably 2.0 mm or more. Further, from the viewpoint of contributing to the miniaturization, the average distance L4 is preferably 3.0 mm or less, and more preferably 2.5 mm or less, and still more preferably 2.0 mm or less.

<2. Production Method>

The insulated heat dissipation substrate according to the present disclosure can be produced by bonding a ceramic substrate with a metal plate or metal foil to produce a bonded substrate, and then forming an electric circuit pattern using a lithography technique and an etching technique, and further carrying out processing for rounding a cross-sectional shape near the tips of the upper surfaces of the conductor layer. It can be produced by forming any circuit pattern.

The bonding of the ceramic substrate with the metal plate or metal foil to produce the bonded substrate can be carried out by any known technique, including, typically, a method of directly bonding the ceramic substrate to the metal plate or metal foil to produce a DCB substrate, and a method of bonding the ceramic substrate to the metal plate or metal foil via a bonding layer formed using a brazing material (a bonding material) containing an active metal to produce an AMB substrate. Among these, the method of heating and pressing (hot-pressing) them using a brazing material containing Ag and Ti is preferable, in terms of enhancing the bonding strength. Since the brazing material is a conductor, the bonding layer is also regarded as a part of the conductor layer in the present disclosure.

In the case of hot pressing using the brazing material, a bonding atmosphere should be a vacuum or Ar atmosphere, because the bonding is not possible when Ti as the active metal is oxidized or nitrided. From the viewpoint of increasing the bonding strength, a bonding pressure is preferably 5 MPa or more. However, if the bonding pressure is too high, the ceramic substrate may be broken during bonding, so the bonding pressure is preferably 25 MPa or less. A bonding temperature may be appropriately adjusted according to types of brazing materials used. When using a brazing material containing Ag and Ti, the bonding temperature is preferably from about 800° C. to 1000° C.

In addition, the brazing material may include those in which one or more of Cu, Sn, In and the like are added to Ag for lowering the melting point, or those in which Ti is added to their alloy powder. Examples of the Ag—Cu—Ti based brazing material include those containing Ag, Cu, and Ti in a composition weight ratio of from 30 to 70%, from 0 to 40%, and from 0.1 to 20%, respectively. It is also possible to use commercially available products that satisfy these composition ranges.

The lithography technique and the etching technique after producing the bonded substrate may be carried out by any well-known method. A particularly suitable etching method may be wet etching. The shape of the side surface of the conductor layer and the shape of the connection portion 106 between the upper surface 104*a* of the conductor layer and the side surface 104*c* of the conductor layer are affected by the etching conditions, and L1, L2, L3 and L4 as described above are changed. Therefore, the etching conditions should be noted.

In order to form the cross-sectional shape where the tip 104*d* of the upper surface of the conductor layer recedes in the normal direction from the tip 104*e* of the lower surface of the conductor layer when the conductor layer 104 and the ceramic substrate 102 are observed in the cross section parallel to both of the normal direction relative to the tangential line of the contour of the conductor layer 104 as viewed in plane and the thickness direction, it is preferable that a desired resist pattern is formed and the wet etching is then carried out. A commercially available wet etching solution can be used as an etching solution, such as an aqueous solution of iron (III) chloride $FeCl_3$ and the like.

In order for the side surface 104 of the conductor layer to have the contour having an inwardly recessed curve line and having a portion receding in the normal direction from the tip 104*d* of the upper surface of the conductor layer when the conductor layer 104 and the ceramic substrate 102 are observed in the cross section parallel to both of the normal direction relative to the tangential line of the contour of the conductor layer 104 as viewed in plane and the thickness direction, it is preferable that a desired resist pattern is formed and the wet etching is then carried out. A commercially available wet etching solution can be used as an etching solution, such as an aqueous solution of iron (III) chloride $FeCl_3$ and the like.

A shorter etching time tends to provide larger L1, smaller L2 and smaller L4. Conversely, a longer etching time tends to provide smaller L1, larger L2 and larger L4. The L3 and L4 can be basically adjusted by the resist pattern, and a wider width for removing the resist (a portion of the conductor layer that is not covered with the resist) provides larger L3 and L4 in general.

Immediately after forming the circuit patterns on the conductor layer by the etching, the cross-sectional shape near the tip of the upper surface of the conductor layer is usually extremely sharp. Therefore, it is important to form the circuit patterns on the conductor layer by the etching and then carry out processing for providing roundness to the cross-sectional shape near the tip of the upper surface of the conductor layer (hereinafter, referred to as "rounding processing"). Examples of the method for the rounding processing include wet blasting, dry blasting, cutting, laser processing, and other machining. In terms of controlling the roundness, the wet blasting is preferable. When employing the wet blasting, a rounded state varies depending on an injecting pressure and an injecting time, a type and particle size of an abrasive used for the wet blasting. Therefore, it is desirable to select appropriate conditions as needed. In general, the maximum radius R of the above circle in the connection portion 106 between the upper surface 104*a* of the conductor layer and the side surface 104*c* of the conductor layer can be increased by increasing the wet blast time, and can be decreased by shortening the wet blast time.

Implementation of the wet blasting tends to provide the cross-sectional shape that is inclined in the downward direction as the upper surface 104*a* of the conductor layer approaches the tip 104*d*. In terms of increasing the bonding area, it is desirable that the inclined length is shorter. In order to make it shorter the length of the inclined portion, it is preferable to shorten the wet blasting time. However, if the wet blasting time is shortened, the above maximum radius R tends to be decreased. Therefore, it is preferable that the conditions of the wet blasting should be set while considering the balance between both.

After the rounding processing, various surface treatments can be carried out. Examples of the surface treatments include, but not limited to, an acid treatment, an alkali treatment, washing, plating, a rust prevention treatment and the like.

Examples

Hereinafter, the present disclosure will be more specifically described by way of examples, but the present disclosure is not limited by these examples.
(1. Production of Insulated Heat Dissipation Substrate)

As a ceramic substrate, a silicon nitride ($Si_3N_4$) substrate having a thickness of 0.3 mm and a rectangular shape (21 mm width×21 mm length) as viewed in plane was prepared. A copper (Cu) plate having an average thickness D of 0.5 mm and a rectangular shape (21 mm width×21 mm length) as viewed in plane was bonded to one side of the silicon nitride substrate by hot pressing using a brazing material to obtain a bonded substrate of the ceramic substrate and the copper plate. As the brazing material, a material having a composition weight ratio of Ag: 51% by mass, Cu: 24% by mass, In: 11% by mass, and Ti: 14% by mass was used. The hot pressing was carried out under a bonding pressure of 20 MPa under vacuum at 850° C.

From the bonded substrate obtained by the above procedure, a conductor pattern as shown in FIG. 3 (an average distance L4 of 1.0 mm, between the tips of the lower surface of adjacent conductor layers) was formed through pattern formation with photolithography and wet etching. As an etching solution, an aqueous solution (pH=1 to 3) containing cupric chloride and ferric chloride was used. The wet etching time was classified into three groups, and each group had the same etching time. Comparative Example 1 and Examples 1 to 3 were in Group 1; Comparative Example 2 and Examples 4 to 6 were in Group 2; and Comparative Example 3 and Examples 7 to 9 were in Group 3. The relationship among the etching time $T_1$ of Group 1, the etching time $T_2$ of Group 2 and the etching time $T_3$ of Group 3 was $T_1<T_2<T_3$.

After forming the conductor pattern, wet blasting was carried out on the conductor pattern-formed surface of the bonded substrate in order to round the cross-sectional shape near the tip of the upper surface of the conductor layer, for Test Examples other than Comparative Examples. The wet blasting was carried out by spraying a slurry of an abrasive (SiC particles having a particle size of from about 10 to 20 μm) in water in a direction perpendicular to the conductor pattern-formed surface, using a wet blasting device. In this case, an injection pressure was 0.15 MPa, a moving speed of a nozzle was 100 mm/sec, and the number of passes was changed as shown in Table 1. With one pass, the slit-shaped nozzle moves from one side of the bonded substrate to the side opposite thereto, whereby the entire surface is wet-blasted once. The number of passes refers to a repeated number of that operation. As the number of passes changed, the maximum radius R of a circle inscribed in the tip of the upper surface of the conductor layer and formable inside the upper surface and the side surface of the conductor layer (hereinafter referred to as an "inscribed circle") and the length of the inclined portion in the normal direction changed as shown in Table 2.

TABLE 1

| Test Nos. | Wet Blasting Number of Passes |
| --- | --- |
| Comparative Example 1 | 0 |
| Example 1 | 100 |
| Example 2 | 500 |
| Example 3 | 1000 |
| Comparative Example 2 | 0 |
| Example 4 | 100 |
| Example 5 | 500 |
| Example 6 | 1000 |
| Comparative Example 3 | 0 |
| Example 7 | 100 |
| Example 8 | 500 |
| Example 9 | 1000 |

(2. Evaluation of Entire Shape)

For the insulated heat dissipation substrate of each Test Example obtained through the above steps, the conductor layer and the ceramic substrate were cut such that the cross section parallel to both of the normal direction relative to the tangential line of the contour of the conductor layer as viewed in plane and the thickness direction was exposed, and embedded in a resin. The exposed cross section was then polished, observed by SEM at magnifications of 80 and evaluated as follows. The results are shown in Table 2.

(A) Evaluation 1

Evaluation was performed for whether or not the tip of the upper surface of the conductor layer receded from the tip of the lower surface of the conductor layer in the normal direction relative to the tangential line of contour of the conductor layer as viewed in plane. The evaluation was performed for arbitrary five cross sections, and a case where all the five cross sections satisfied the above conditions was determined to be "YES", and all other cases were determined to be "NO".

(B) Evaluation 2

Evaluation was performed for whether or not the side surface of the conductor layer had a contour having an inwardly recessed curve line and having a portion receding in the normal direction relative to the tangential line of the contour of the conductor layer as viewed in plane from the tip of the upper surface of the conductor layer. The evaluation was performed for arbitrary five cross sections, and a case where all the five cross sections satisfied the above conditions was determined to be "YES", and all other cases were determined to be "NO".

(C) Evaluation 3

The distance L1 in the normal direction relative to the tangential line of the contour of the conductor layer as viewed in plane from the tip of the lower surface of the conductor layer to the tip of the upper surface of the conductor layer, and the distance L2 in the normal direction of the conductor layer from the tip of the upper surface to the most receding portion in the normal direction of the conductor layer on the side surface of the conductor layer were measured. Each measurement was performed for arbitrary five cross sections, and average values of the five cross sections was determined to be the measurement values of L1 and L2, and ratios D/L1, D/L2, and D/(L1+L2) were calculated.

(D) Evaluation 4

The distance L3 between the tips of the upper surface of the adjacent conductor layers in the normal direction was measured. The measurement was performed for arbitrary five cross sections, and an average value of the five cross sections was determined to be the measurement value of L3.

(E) Evaluation 5

Evaluation was performed for whether or not the upper surface of the conductor layer was inclined downward as it approached its tip. The evaluation was performed for arbitrary five cross sections, and a case where all the five cross sections satisfied the above conditions was determined to be "YES", and all other cases were determined to be "NO".

(3. Shape Evaluation of Connection Portion Between Upper Surface and Side Surface of Conductor Layer)

SEM observation was carried out at magnifications of 3000 using samples when the entire shapes were evaluated. The maximum radius R of the circle inscribed in the tip of the upper surface of the conductor layer and formable inside the upper surface and the side surface of the conductor layer was measured. Further, when the inclined portion was present in the conductor layer, the length of the inclined portion in the normal direction was measured. The measurement was performed for arbitrary five cross sections, and average value of the five cross sections was determined to be each measurement value. The results are shown in Table 2.

TABLE 2

| | | | Entire Shape | | | | | | | Shape of connection portion |
|---|---|---|---|---|---|---|---|---|---|---|
| | | | | | Evaluation 3 | | | | Evaluation 5 (Length of | Maximum Radius (R) of |
| | Evaluation 1 | Evaluation 2 | L1 (μm) | L2 (μm) | L1 + L2 (μm) | D/L1 | D/L2 | D/(L1 + L2) | Evaluation 4 L3 (mm) | inclined portion) | inscribed circle (μm) |
| Comparative Example 1 | YES | YES | 10 | 40 | 50 | 50.0 | 12.5 | 10.0 | 1.02 | No (—) | 0.01 or less |
| Example 1 | YES | YES | 10 | 25 | 35 | 50.0 | 20.0 | 14.3 | 1.02 | YES (150 μm) | 0.4 |
| Example 2 | YES | YES | 15 | 60 | 75 | 33.3 | 8.3 | 6.7 | 1.03 | YES (200 μm) | 2.1 |
| Example 3 | YES | YES | 20 | 40 | 60 | 25.0 | 12.5 | 8.3 | 1.04 | YES (280 μm) | 4.8 |
| Comparative Example 2 | YES | YES | 100 | 100 | 200 | 5.0 | 5.0 | 2.5 | 1.20 | No (—) | 0.01 or less |
| Example 4 | YES | YES | 100 | 100 | 200 | 5.0 | 5.0 | 2.5 | 1.20 | YES (160 μm) | 0.5 |
| Example 5 | YES | YES | 110 | 90 | 200 | 4.5 | 5.6 | 2.5 | 1.22 | YES (210 μm) | 2.5 |
| Example 6 | YES | YES | 90 | 95 | 185 | 5.6 | 5.3 | 2.7 | 1.18 | YES (260 μm) | 4.3 |
| Comparative Example 3 | YES | YES | 270 | 100 | 370 | 1.9 | 5.0 | 1.4 | 1.54 | No (—) | 0.01 or less |
| Example 7 | YES | YES | 290 | 90 | 380 | 1.7 | 5.6 | 1.3 | 1.58 | YES (180 μm) | 0.6 |
| Example 8 | YES | YES | 285 | 95 | 380 | 1.8 | 5.3 | 1.3 | 1.57 | YES (220 μm) | 3 |
| Example 9 | YES | YES | 270 | 85 | 355 | 1.9 | 5.9 | 1.4 | 1.54 | YES (290 μm) | 4.9 |

(3. Measurement of Initial Voltage of Electric Discharge)

An initial voltage of electric discharge was measured for the insulated heat dissipation substrate of each of Test Examples obtained through the above steps. The measurement was performed by applying an AC voltage (effective value) between island-shaped metal plates A and B as shown in FIG. 3 for 10 seconds at a frequency of 60 Hz. When no electric discharge was confirmed by a given alternating voltage, the alternating voltage (effective value) was increased by 1 kV and applied. This operation was repeated to measure the AC voltage (effective value) when the electric discharge was first confirmed. An average value of five measurements was determined to be the measurement value. The results are shown in Table 3.

(4. Cooling/Heating Cycle Test)

A cooling/heating cycle test was conducted on the insulated heat dissipation substrate of each of Test Examples obtained through the above steps. The cooling/heating cycle test was conducted where a cooling/heating cycle of −55° C. (15 minutes)/175° C. (15 minutes) was repeated 3000 cyc (cycles). Every 100 cyc in the course of the process (that is, total 30 times), the presence or absence of peeling off of the bonded portion and cracks in the ceramic substrate (hereinafter collectively referred to as "defect") was confirmed by appearance check with a stereoscopic microscope and ultrasonic inspection, and the cycle number in which the cooling/heating cycle test could be carried out without defect was evaluated.

The results are shown in Table 3. For example, "500" indicates that the defect did not occur until the first 500 cyc, but the defect occurred during observation at the end of 600 cyc. Further, "3000" indicates that no defect occurred before conducting 3000 cyc.

TABLE 3

| | Characterization | |
|---|---|---|
| | Initial Voltage of Discharge (Effective Value) (kV) | Cooling/Heating Cycle durability Number of cycle |
| Comparative Example 1 | 6.4 | 500 |
| Example 1 | 11.7 | 500 |
| Example 2 | 12.3 | 500 |
| Example 3 | 12.9 | 500 |
| Comparative Example 2 | 7.5 | 1000 |
| Example 4 | 13.8 | 1000 |
| Example 5 | 14.6 | 1000 |
| Example 6 | 14.6 | 1000 |
| Comparative Example 3 | 9.7 | 3000 |
| Example 7 | 18.1 | 3000 |
| Example 8 | 18.7 | 3000 |
| Example 9 | 19.1 | 3000 |

(5. Discussion)

It is understood from the above results that the electrical insulating properties between the adjacent conductor layers are significantly improved only by forming the connection portion between the upper surface and side surface of the conductor layer into a slightly rounded cross-sectional shape. It is also understood that the cooling/heating cycle durability can be improved by forming the side surface of the conductor layer into an inwardly recessed curve shape and increasing L1, L2 and L1+L2 (in other words, decreasing the ratios D/L1, D/L2, and D/(L1+L2)). When producing the insulated heat dissipation substrate, an appropriate cross-sectional shape may be constructed depending on specifications of the electrical insulating properties, cooling/heating cycle durability and bonding area required for each product.

DESCRIPTION OF REFERENCE NUMERALS 100 insulated heat dissipation substrate
102 ceramic substrate
104 conductor layer
104a upper surface of conductor layer
104b lower surface of conductor layer
104c side surface of conductor layer
104d tip of upper surface of conductor layer
104e tip of lower surface of conductor layer
106 connection portion between upper surface and side surface
108 connection portion between lower surface and side surface

What is claimed is:

1. An insulated heat dissipation substrate comprising: a ceramic substrate; and a conductor layer bonded onto at least one of main surfaces of the ceramic substrate,
wherein the conductor layer comprises: an upper surface; a lower surface bonded to the ceramic substrate; and a side surface connecting the upper surface with the lower surface;
wherein, when the conductor layer and the ceramic substrate are observed in a cross section parallel to both of a normal direction relative to a tangential line of a contour of the conductor layer as viewed in plane and a thickness direction,
a tip of the upper surface recedes in the normal direction of the conductor layer from a tip of the lower surface;
the side surface has a contour having an inwardly recessed curve line and having a portion receding in the normal direction of the conductor layer from the tip of the upper surface; and
a connection portion between the upper surface and the side surface has a rounded shape such that a maximum radius R of a circle is 0.1 μm≤R≤5 μm on average, the circle being inscribed in the tip of the upper surface and formable inside the upper surface and the side surface.

2. The insulated heat dissipation substrate according to claim 1, wherein, when the conductor layer and the ceramic substrate are observed in the cross section parallel to both of the normal direction of the conductor layer and the thickness direction, an average distance L1 in the normal direction of the conductor layer from the tip of the lower surface to the tip of the upper surface and an average thickness D of the conductor layer satisfy a relationship: $1 \leq D/L1 \leq 50$.

3. The insulated heat dissipation substrate according to claim 1, wherein, when the conductor layer and the ceramic substrate are observed in the cross section parallel to both of the normal direction of the conductor layer and the thickness direction, an average distance L2 in the normal direction of the conductor layer from the tip of the upper surface to the most receding portion of the side surface in the normal direction of the conductor layer and an average thickness D of the conductor layer satisfy a relationship: $1 \leq D/L2 \leq 20$.

4. The insulated heat dissipation substrate according to claim 1, wherein, when the conductor layer and the ceramic substrate are observed in the cross section parallel to both of the normal direction of the conductor layer and the thickness direction, an average distance L1 in the normal direction of the conductor layer from the tip of the lower surface to the tip of the upper surface, an average distance L2 layer in the normal direction of the conductor from the tip of the upper surface to the most receding portion of the side surface in the normal direction of the conductor layer and an average thickness D of the conductor layer satisfy a relationship: $1 \leq D/(L1+L2) \leq 15$.

5. The insulated heat dissipation substrate according to claim 1, wherein, when the conductor layer and the ceramic substrate are observed in the cross section parallel to both of the normal direction of the conductor layer and the thickness direction, the upper surface has a portion inclined in a downward direction as it approaches the tip of the upper surface, and a length of the portion in the normal direction is 300 μm or less on average.

* * * * *